United States Patent
Amundson

(10) Patent No.: US 7,895,544 B2
(45) Date of Patent: Feb. 22, 2011

(54) METHOD TO GRAPHICALLY IDENTIFY REGISTERS WITH UNBALANCED SLACK AS PART OF PLACEMENT DRIVEN SYNTHESIS OPTIMIZATION

(75) Inventor: Michael D. Amundson, Oronoco, MN (US)

(73) Assignee: International Business Machines Corporation, Armonk, NY (US)

( * ) Notice: Subject to any disclaimer, the term of this patent is extended or adjusted under 35 U.S.C. 154(b) by 342 days.

(21) Appl. No.: 12/207,814

(22) Filed: Sep. 10, 2008

(65) Prior Publication Data

US 2010/0064264 A1 Mar. 11, 2010

(51) Int. Cl.
*G06F 17/50* (2006.01)
(52) U.S. Cl. ............ 716/8; 716/6; 716/9; 716/10; 716/11
(58) Field of Classification Search ........... 716/6, 716/8–11
See application file for complete search history.

(56) References Cited

U.S. PATENT DOCUMENTS

| | | | | |
|---|---|---|---|---|
| 5,237,514 A * | 8/1993 | Curtin | ............ | 716/10 |
| 5,896,301 A * | 4/1999 | Barrientos | ............ | 716/8 |
| 7,100,140 B2 | 8/2006 | Amundson et al. | | |
| 7,137,090 B1 * | 11/2006 | Manaker et al. | ............ | 716/6 |
| 7,162,706 B2 * | 1/2007 | Kuang et al. | ............ | 716/6 |
| 7,356,793 B2 * | 4/2008 | Curtin et al. | ............ | 716/6 |
| 7,380,228 B2 * | 5/2008 | Fry et al. | ............ | 716/6 |
| 7,580,037 B1 * | 8/2009 | Iotov | ............ | 345/440 |
| 7,584,441 B2 * | 9/2009 | Gidon et al. | ............ | 716/6 |
| 7,624,364 B2 * | 11/2009 | Albrecht et al. | ............ | 716/6 |
| 7,743,354 B2 * | 6/2010 | Albrecht et al. | ............ | 716/6 |
| 7,784,008 B1 * | 8/2010 | Hutton et al. | ............ | 716/12 |
| 2005/0268258 A1 * | 12/2005 | Decker | ............ | 716/4 |
| 2006/0010410 A1 * | 1/2006 | Curtin et al. | ............ | 716/6 |
| 2008/0052655 A1 * | 2/2008 | Curtin et al. | ............ | 716/6 |
| 2009/0083685 A1 * | 3/2009 | Gidon et al. | ............ | 716/6 |
| 2010/0115477 A1 * | 5/2010 | Albrecht et al. | ............ | 716/2 |

* cited by examiner

*Primary Examiner*—Naum B Levin
(74) *Attorney, Agent, or Firm*—Cantor Colburn LLP

(57) ABSTRACT

A method for identifying latches in physical designs with unbalanced slack, comprising: creating a netlist describing a logical design, the logical design having a plurality of latches therein; performing a placement of the logical design to obtain a physical design; measuring a slack difference of each of the plurality of latches; selecting a color for each of the plurality of latches based on the slack difference correspondingly measured for each of the plurality of latches; and generating a graphical image identifying each one of the plurality of latches with slack difference in color, the color selected for each one of the plurality of latches with slack difference being indicative of the severity of the slack difference.

6 Claims, 5 Drawing Sheets

US 7,895,544 B2

METHOD TO GRAPHICALLY IDENTIFY REGISTERS WITH UNBALANCED SLACK AS PART OF PLACEMENT DRIVEN SYNTHESIS OPTIMIZATION

BACKGROUND

This invention relates to Electronic Design Automation (EDA) systems, and particularly to a method for graphically identifying registers with unbalanced slack during placement driven synthesis optimization.

EDA tools are used to aid in the development of integrated circuits. The placement driven synthesis tool is used to optimize a given set of logic gates to meet physical, timing, electrical, area, and power constraints. During the development process it is common to see a timing violation (i.e., negative slack) on the input of a latch and not the output, or vice versa. Such a scenario may be the result of poor placement, poor optimization, or poor logic design.

Currently, latches with "unbalanced" slacks can be optimized using EinsTimer's clock skew scheduling. Einstimer attempts to balance the slacks as best it can by adjusting the arrival time of the clock. A textual report is generated and the in-core design can be updated with these new constraints. However, a textual report is missing vital information such as the placement of the latches. Even if the report were to include placement locations, it would be quite difficult to visualize. The EinsTimer report does generate an image, but it is only a two-dimensional graph showing a histogram of the modified skews, it does not plot the design itself. Additional optimizations attempt to balance slack by replacing the latch or its associated logic cone. These optimizations modify the netlist without visualizing how the optimization performed. In some cases, a textual report is issued which is still inadequate.

These latches could be identified using an interactive physical design browser, such as, IBM Chipbench. While this browser aids in debug, there can be substantial runtime to load the design into a proper timing environment. Also, the interactive browser only depicts the current state of the netlist and cannot easily compare before and after effects of an optimization from placement driven synthesis.

SUMMARY

An exemplary embodiment of a method for identifying latches in physical designs with unbalanced slack, the method comprising: creating a netlist describing a logical design, the logical design having a plurality of latches therein; performing a placement of the logical design to obtain a physical design; measuring a slack difference of each of the plurality of latches; selecting a color for each of the plurality of latches based on the slack difference correspondingly measured for each of the plurality of latches; and generating a graphical image identifying each one of the plurality of latches with slack difference in color, the color selected for each one of the plurality of latches with slack difference being indicative of the severity of the slack difference.

An exemplary embodiment of a method for identifying latches in physical designs with unbalanced slack, the method comprising: creating a netlist describing a logical design, the logical design having a plurality of latches therein; performing a placement of the logical design to obtain a physical design; measuring a slack difference of each of the plurality of latches; selecting a color for each of the plurality of latches based on the slack difference correspondingly measured for each of the plurality of latches; generating a first graphical image identifying each one of the plurality of latches with slack difference, the color selected for each one of the plurality of latches with slack difference being indicative of the severity of the slack difference; optimizing the netlist during PDS optimization; and generating a second graphical image identifying each one of the plurality of latches with slack difference as a result of the optimization, the second graphical image being generating concurrent with PDS optimization.

An exemplary embodiment of a system for identifying latches in physical designs with unbalanced slack, the system comprising: a placement driven synthesis (PDS) module configured to receive a netlist describing a logical design having a plurality of latches therein, the PDS module performs a placement of the logical design to obtain a physical design; a PDS graphical system in communication with the PDS module, the PDS graphical system measures a slack difference of each of the plurality of latches and selects a color for each of the plurality of latches based on the slack difference correspondingly measured for each of the plurality of latches; and a graphics application program interface (API) module in communication with the PDS graphical system, the graphics API module generates a graphical image identifying each one of the plurality of latches with slack difference in color, the color selected for each one of the plurality of latches with slack difference being indicative of the severity of the slack difference.

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Exemplary embodiments of the present invention provide a system, method and program product for the generation of images or visualizations that graphically identify the placement location of registers or latches within a chip design itself concurrent with PDS optimization. These images may also graphically identify latches within the chip design with unbalanced slack concurrent with PDS optimization. The systems and methods described herein enable designers to optimize the chip design based on the unbalanced slack (e.g., the designer may invoke specific optimizations to improve slack balancing) and quickly determine whether the design has become more or less balanced as a result of optimizations. In other words, these images can quickly identify registers with unbalanced slack and conclude whether the optimizations were successful or not.

In accordance with exemplary embodiments of the present invention, the images illustrate latches in the chip design with unbalanced slack by coloring the latches according to the severity of their unbalanced slack and whether its input slack is worse than its output slack. These images can further graphically illustrate the placement location of the latches in the design with respect to one another on the chip or integrated device itself. As such, a single image can be generated that enables the user to visually identify latches with unbalanced slack as well as differentiate between latches with greater input slack to latches with greater output slack, and also visually determine the physical location of the latches in the chip design itself. Several images can be generated during the PDS optimization process automatically or manually as desired.

Figure 1:
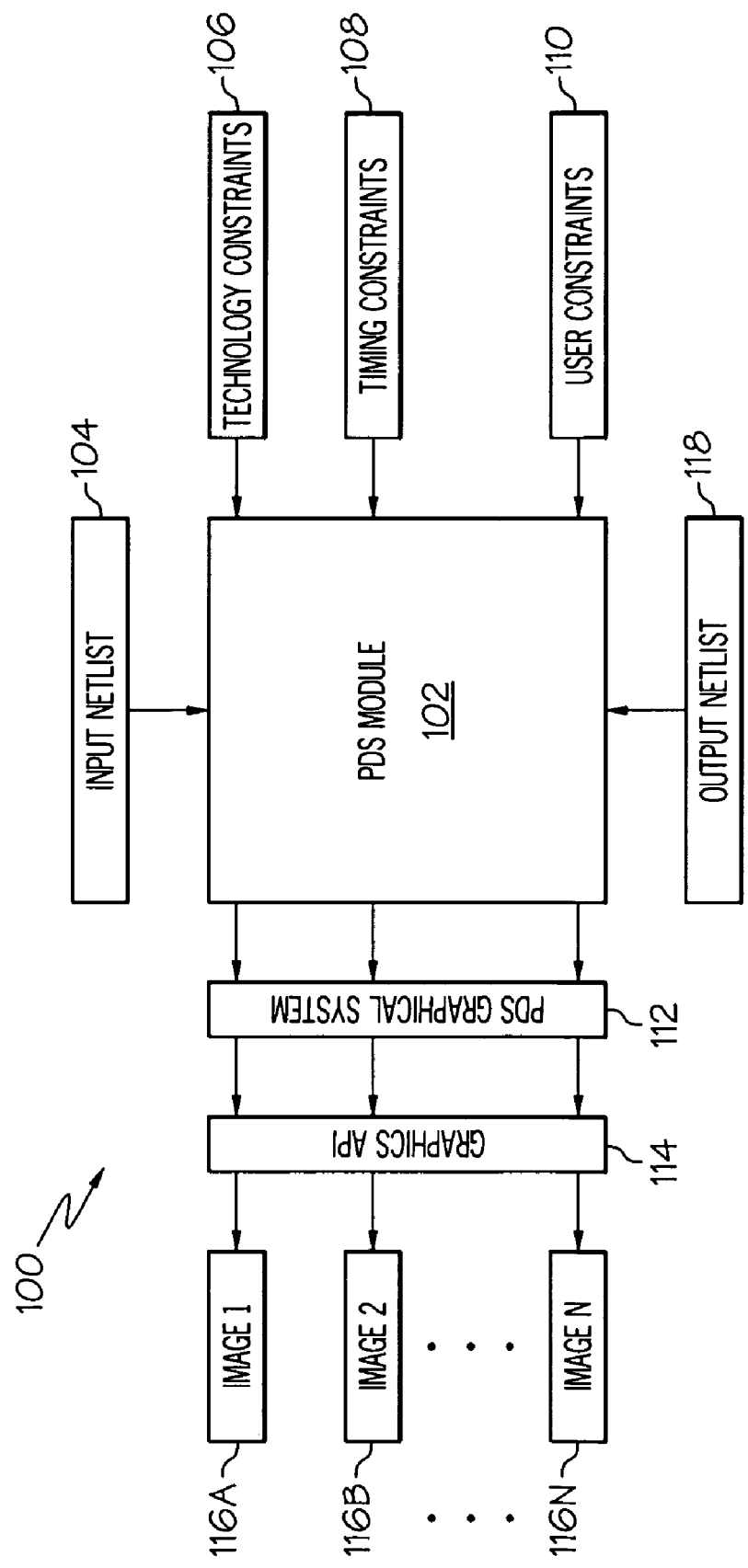
FIG. 1 is a block diagram of how a PDS system interfaces with a graphical system to generate images that identify latches within a chip design with unbalanced slack during placement driven synthesis in accordance with one exemplary embodiment of the present invention.

Now referring to the drawings, FIG. 1 is a block diagram of how the PDS system interfaces with a graphical system to generate images that identify latches within the chip design with unbalanced slack during the PDS process, shown generally at 100. A set of input data is provided to a PDS module 102. The set of input data includes, but is not limited to, an input netlist 104 that describes the chip design itself, technology constraints 106, timing constraints 108, and user constraints 110. The constraints 106-110 can be considered as secondary inputs for optimizing the netlist. Once the set of input data is provided to the PDS module 102, the PDS module 102 performs the PDS process, which optimizes the netlist based on the secondary inputs. More specifically, once the input netlist 104 describing the logical design of the chip design is received, a placement of the logical design is performed to obtain a physical design of the chip design. The netlist 104 can be optimized through the secondary inputs during PDS optimization. During the PDS process, graphical images are generated to identify latches in the chip design with unbalanced slack and the placement location of each of the identified latches with respect to one another. The images can be generated automatically, manually or both.

In accordance with one exemplary embodiment, the PDS module 102 operably interacts with a PDS graphical system 112 and a graphics application program interface (API) module 114 in order to produce graphical images of unbalanced slack data and/or placement location data 116A-116N. In accordance with one embodiment, the graphics API module 114 is a graphics software package (e.g., GD, plotutils, or any other available software package developed externally or in-house) that generates the "images" (e.g., produces a JPEG file based on the data from the PDS graphical system 112). At the conclusion of placement driven synthesis, an output netlist 118 is generated in accordance with one exemplary embodiment. The output netlist 118 comprises of a textual report of connectivity and placement information that describe the chip design and the components therein.

Figure 2:
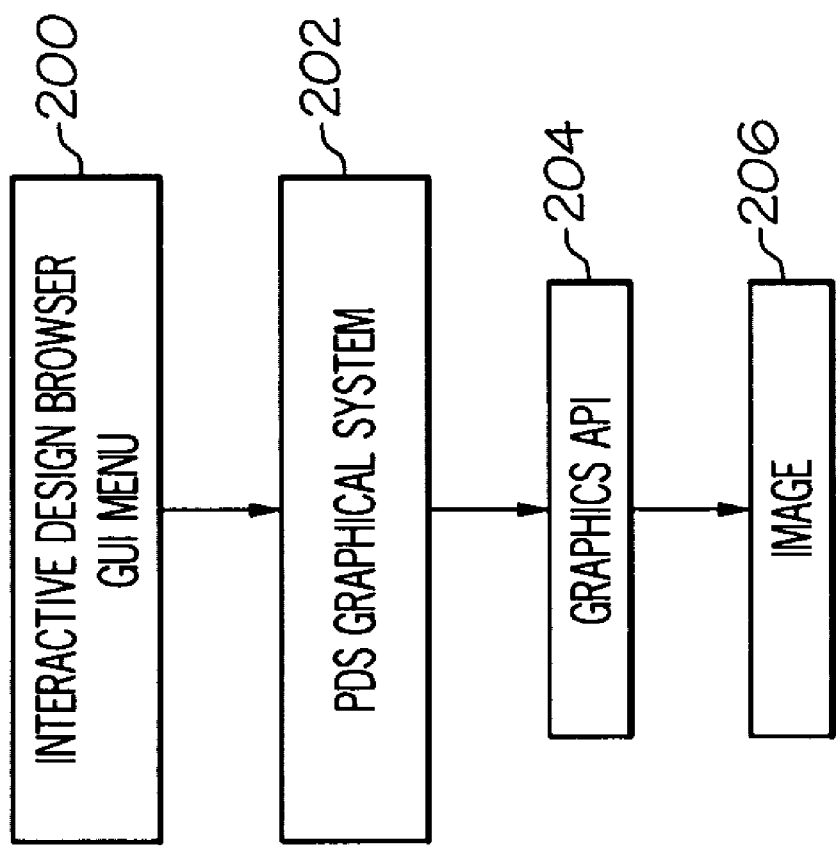
FIG. 2 is a design flow diagram of the interactive use of the system in accordance with one exemplary embodiment of the present invention.

FIG. 2 illustrates a design flow diagram of the interactive use of the system in accordance with one exemplary embodiment. At block 200, a menu or GUI within an interactive design browser can be used to manually generate a slack imbalance image. The slack imbalance report is generated through the PDS graphical system at block 202. Then, the graphics API interacts with the PDS graphical system at block 204 to generate an image at block 206. Images that can be generated include, but should not be limited to, a visual of the placement location of each of the latches in the chip design (physical location on the chip itself), a visual of the latches in the chip design with unbalanced slack (e.g., slack difference), a visual of the severity of the unbalanced slack of each of the identified latches, and a visual of whether the slack at the input side is worse than the slack at the output side of each of the identified latches. A single image can be generated to include one or a combination of visuals described above and should not be limited to the examples described herein.

In accordance with one exemplary embodiment, the PDS graphical system 112 references a static timing system to query slack at the input pin and the output pin of each of the latches in the chip design in order to generate graphical images that identify latches in the chip design with a slack difference. In accordance with one exemplary embodiment, the PDS graphical system 112 operably queries the PDS module 102 and determines whether constraints have been defined to control the image through input data (i.e., user constraints 110).

The image can be controlled in various ways. If desired, the user can exclude slacks that are outside a particular range (min<slack<max). For example, the image can be generated to include only latches with negative slack by setting the max to 0. Likewise, the user can enforce a bounded slack difference (min<diff<max) to exclude latches with a slack difference that falls outside the bounded slack difference.

Other ways to control the image includes taking the "raw" difference of the slack difference. For example, if the latch has an input slack of −6 and an output slack of +4, the raw slack difference is 10. In contrast, the user can take the absolute slack different. For example, if the input slack was +6 and the output slack was −4, the difference is −10. Using an absolute difference, the difference is +10. While this method prevents the user from distinguishing latches with worse input slack or worse output slack, it identifies latches with a large difference, be it on the input side or output side. Optionally, the raw difference or the absolute slack difference can be normalized by cycle time (maximum time between latch points). Of course, other ways to control the image can be used in accordance with other exemplary embodiments and should not be limited to the examples set forth above.

Figure 3:
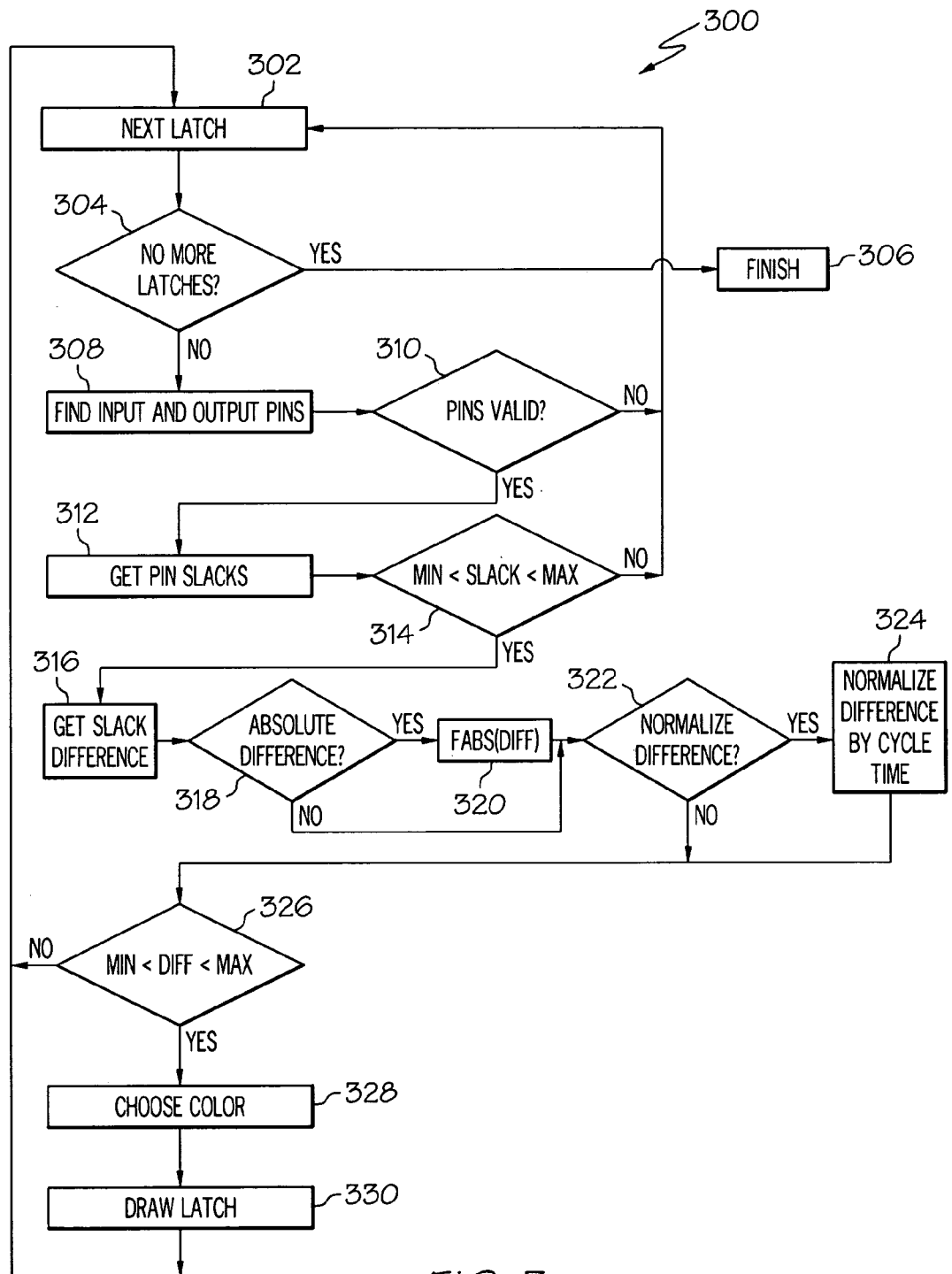
FIG. 3 is an exemplary flow diagram of the operational steps for generating graphical images that identify latches in the chip design with unbalanced slack as well as the placement location of each of the identified latches in the chip design in accordance with one exemplary embodiment of the present invention.

In accordance with one exemplary embodiment, FIG. 3 illustrates an exemplary flow diagram of the operational blocks for generating graphical images that identify latches in the chip design with unbalanced slack as well as the placement location of each of the identified latches in the chip design, shown generally at block 300. At block 302, query for a latch in the chip design. In accordance with one exemplary embodiment, the PDS graphical module 112 queries the PDS module for the latch. Next, determine if there are any more latches in the chip design at block 304. If the answer is no, then end the query at block 306. If the answer is yes, find the input and output pins of the latch at block 308. At block 310, determine if the pins are valid. If the answer is no, query for the next latch back at block 302. If the answer is yes, determine the pin slacks at block 312. In accordance with one exemplary embodiment, the PDS graphical module 112 queries the static timing system to determine the pin slacks of the latch. Determine whether the pin slacks are within a particular range at block 314. Block 314 is performed when the user defines such a constraint. If the answer is no, query for the next latch back at block 302. If the answer is yes, measure the slack difference at block 316. In block 318, determine whether to take the absolute difference of the slack difference. If the answer is yes, take the absolute difference of the slack difference at block 320. Block 320 is performed when the user defines such a constraint. If the answer is yes, skip block 320 maintaining the raw difference of the slack difference. Next, determine whether to normalize the difference (absolute or raw) by cycle time at block 322. If the answer is yes, normalize difference by cycle time at block 324. Block 324 is performed when the user defines such a constraint. Then, determine whether the difference is outside the bounded slack difference in block 326. Block 326 is performed when the user defines such a constraint. If the answer is no, query for the next latch back at block 302. If the answer is yes, select a color for the latch at block 328. In accordance with one embodiment, the color for the latch is selected based on the severity of the difference and whether the input slack is worse than the output slack of that latch. At block 330, draw the latch on the graph using the color selected. The latch is further drawn on the graph based on its physical location on the chip design itself. Operational blocks 302-330 are performed until all the latches on the chip design have been queried. It should be understood that checks at block 314, 322, 324, and 326 are optional and are not intended to be limiting.

Figure 4:
FIG. 4 is an exemplary graphical image identifying latches with unbalanced slack in color and the placement location of each with respect to one another in accordance with one exemplary embodiment of the present invention.

FIG. 4 illustrates an exemplary image that can be generated once the latches in the chip design have been queried as described above. This exemplary image is shown in grayscale instead of color. However, it should be understood that such images are in color as described above. In this example, all the latches identified with a slack difference are colored according to their slack unbalancing. More specifically, the latches identified with a slack difference are colored based on the severity of the slack difference and whether their input slack is worse than their output slack. Further, the latches identified are plotted on the image according to their placement on the chip design itself.

In accordance with one exemplary embodiment, the coloring algorithm is based on raw slack difference. In accordance with another exemplary embodiment, the coloring scheme uses the slack difference as a percentage of design cycle time. Thus, coloring remains consistent across designs with drastically different cycle times. For example, a design with cycle time 1000 and slack difference of 100 would be colored the same as a design with cycle time of 250 with slack difference of 25.

In accordance with one exemplary embodiment, a first set of colors and a second set of colors are set to differentiate between latches with a worse input slack and latches with a worse output slack. In accordance with one non-limiting exemplary embodiment, the color scheme in a red-green-blue (RGB) spectrum is used to select colors, where the midpoint of the RGB spectrum can be chosen as the midpoint (0% difference). In one non-limiting exemplary embodiment, blue-green colors are set for latches having worse input slack while yellow-orange-red colors are set for latches having worse output slack. For example, latches with worse input slack (input_worse) can be colored to any one of the following colors based on the severity of the slack: medium blue; blue; forest green; dark sea green; pale green; green, while latches with worse output slack (output_slack) can be colored to any one of the following colors based on the severity of the slack: green; yellow; gold; orange; red; magenta; violet red. The colors are based both on severity of the difference and whether the input slack is worse than the output slack or vice versa. For example, a latch colored pale green has greater input slack than a latch colored forest green.

Any number of colors and color schemes can be used for the first set of colors and the second set of colors depending on application. The more colors listed, the more fine-grained the coloring. In the example above, the first set of colors contains six colors. Therefore, for every 16% of cycle time a new color is chosen (differences over 100% are specifically identified and colored accordingly). If there were ten colors in the list, colors would change every 10% cycle time.

Figure 5:
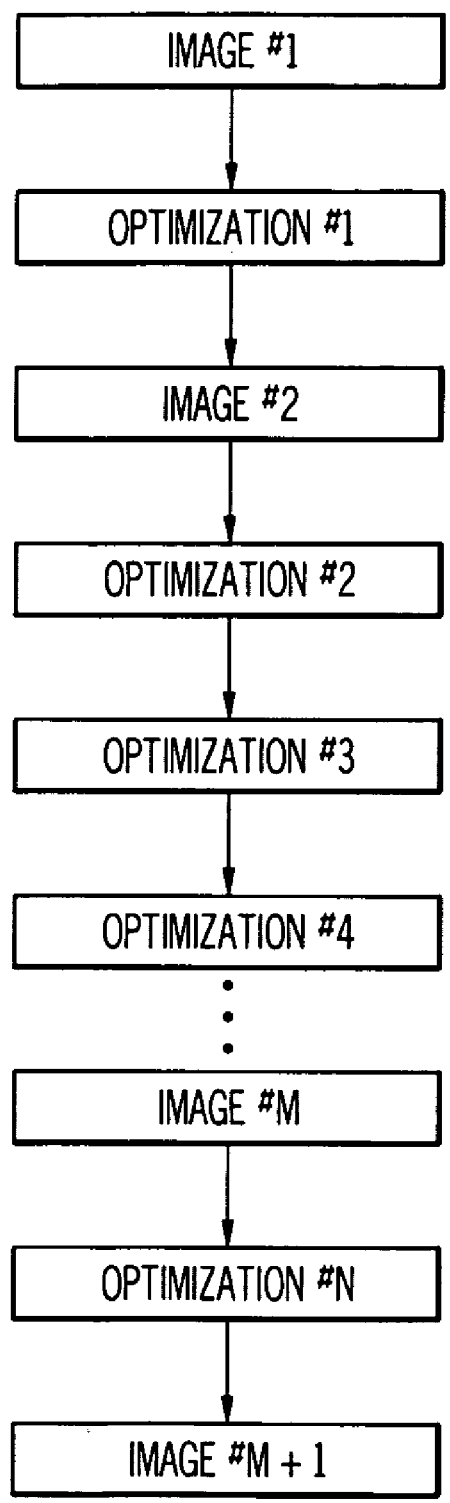
FIG. 5 a high-level design flow diagram on the generation of images of unbalanced slack data during the placement driven synthesis in accordance with one exemplary embodiment of the present invention.

The methods described herein work in concert with a textual report such as the EinsTimer clock skew scheduling in accordance with one exemplary embodiment. As such, numeric information relating to the chip design can be obtained as well. The images or visualizations can be generated before and after optimizations as shown in FIG. 5. This enables the user to make optimizations (e.g., move logic across latch points) and determine whether those optimizations are successful.

In accordance with one exemplary embodiment, non-latch logic can be hidden in the image to reduce complexity and superfluity especially for large designs where latch sizes are relatively small when compared to the size of the design.

Exemplary embodiments of the present invention provide a system and method for generating graphical information during PDS optimization, which can be quickly visualized and interpreted by the end user. These visualizations are beneficial for end users (designers) as well as EDA developers. The user could quickly identify "problem" areas in the design whereas the developer could use the visualizations to identify problems in the application software. The end user can decide whether or not to debug the problem areas in a design browser based on the information from the image.

It should be understood that each block of the flowchart illustrations, and combinations of blocks in the flowchart illustrations, can be implemented by computer program instructions. These computer program instructions may be provided to a processor or other programmable data processing apparatus to produce a machine, such that the instructions, which execute on the processor or other programmable data processing apparatus create means for implementing the functions specified in the flow chart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustrations support combinations of means for performing the specified functions, combinations of blocks for performing the specified functions and program instruction means for performing the specified functions. It will also be understood that each block of the flowchart illustrations, and combination of blocks in the flowchart illustrations, can be implemented by special purpose hardware-based computer systems which perform the specified functions or blocks, or by combinations of special purpose hardware and computer instructions.

Furthermore, the flowcharts are provided to demonstrate the operations performed within the illustrative embodiments. The flowcharts are not meant to state or imply limitations with regard to the specific operations or, more particularly, the order of the operations. The operations of the flowcharts may be modified to suit a particular implementation without departing from the spirit and scope of the present invention.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the blocks (or operations) described therein without departing from the spirit of the invention. For instance, the blocks may be performed in a differing order, or blocks may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A system for identifying latches in physical designs with unbalanced slack, comprising:
   a placement driven synthesis (PDS) module configured to receive a netlist describing a logical design having a plurality of latches therein, the PDS module performs a placement of the logical design to obtain a physical design;
   a PDS graphical system in communication with the PDS module, the PDS graphical system measures a slack difference of each of the plurality of latches and selects a color for each of the plurality of latches based on the slack difference correspondingly measured for each of the plurality of latches; and
   a graphics application program interface (API) module in communication with the PDS graphical system, the graphics API module generates a graphical image identifying each one of the plurality of latches with slack difference in color, the color selected for each one of the plurality of latches with slack difference being indicative of the severity of the slack difference.

2. The system as in claim 1, wherein the color selected for each one of the plurality of latches with slack difference differentiates between latches with greater input slack and latches with greater output slack, the color for latches with greater input slack is selected from a first range of colors while the color for latches with greater output slack is selected from a second range of colors.

3. The system as in claim 1, wherein the graphical image plots each one of the plurality of latches with slack difference according to the placement location of each of the plurality of latches on the integrated circuit.

4. The system as in claim 1, wherein the graphical image is generated concurrent with the performance of the placement driven synthesis.

5. The system as in claim 1, wherein an absolute difference of the slack difference of each of the plurality of latches is calculated and normalized by design cycle time before the color for each one of the plurality of latches with slack difference is selected.

6. The system as in claim 1, wherein a raw difference of the slack difference of each of the plurality of latches is calculated and normalized by design cycle time before the color for each one of the plurality of latches with slack difference is selected.

* * * * *